(12) United States Patent
Lamminger

(10) Patent No.: US 11,225,146 B2
(45) Date of Patent: Jan. 18, 2022

(54) CONTROL DEVICE FOR A VEHICLE

(71) Applicant: BEHR-HELLA THERMOCONTROL GMBH, Stuttgart (DE)

(72) Inventor: Egbert Lamminger, Soest (DE)

(73) Assignee: BEHR-HELLA THERMOCONTROL GMBH, Stuttgart (DE)

( * ) Notice: Subject to any disclaimer, the term of this patent is extended or adjusted under 35 U.S.C. 154(b) by 0 days.

(21) Appl. No.: 17/046,092

(22) PCT Filed: Apr. 4, 2019

(86) PCT No.: PCT/EP2019/058540
§ 371 (c)(1),
(2) Date: Oct. 8, 2020

(87) PCT Pub. No.: WO2019/197273
PCT Pub. Date: Oct. 17, 2019

(65) Prior Publication Data
US 2021/0031632 A1    Feb. 4, 2021

(30) Foreign Application Priority Data

Apr. 13, 2018  (DE) ..................... 10 2018 108 847.7

(51) Int. Cl.
B60K 37/06 (2006.01)
H03K 17/96 (2006.01)

(52) U.S. Cl.
CPC ......... *B60K 37/06* (2013.01); *H03K 17/9645* (2013.01); *B60K 2370/128* (2019.05);
(Continued)

(58) Field of Classification Search
CPC .............. B60K 37/06; B60K 2370/143; B60K 2370/158; B60K 2370/691;
(Continued)

(56) References Cited

U.S. PATENT DOCUMENTS 9,619,522 B2   4/2017  Bastide et al.
2008/0316064 A1  12/2008  Wang
2012/0044660 A1*  2/2012  Rappoport ............. H01H 13/14
                                               361/807

FOREIGN PATENT DOCUMENTS

WO    2004/055846 A1    7/2004

OTHER PUBLICATIONS

International Search Report and Written Opinion issued in corresponding International Application No. PCT/EP2019/058540 dated May 29, 2019, with English translation.

* cited by examiner

*Primary Examiner* — Tomi Skibinski
(74) *Attorney, Agent, or Firm* — Morgan, Lewis & Bockius LLP

(57) ABSTRACT

The operating device (10) for a vehicle is provided with a housing (12) having a front wall (14). On the front wall (14) there is at least one operating element (18) which can be operated manually starting from an initial position for the purpose of inputting a command or activating a function. The operating element (18) has associated therewith a switch (32) having a switching member (36) upon which the operating key acts when manually operated. A supporting element (24) is also situated in the housing (12) at a distance from the operating element (18), on which supporting element (24) the switch (32) associated with the operating element (18) is situated, wherein the supporting element (24) has a flexible bar (40) having an upper surface (42) facing the operating element (18) and a lower surface (44) facing away from the upper surface (42), and the switch (32) is situated on the flexible bar. Finally, the operating device (10) is provided with an adjustment member (46) which acts upon the flexible bar (40) to adjust the bending position of the flexible bar (40) relative to the operating element (18) in
(Continued)

the initial position thereof and to maintain and thus stabilize the flexible bar (40) in the adjusted bending position thereof when the operating element (18) acts upon the switching member (36).

13 Claims, 2 Drawing Sheets

(52) U.S. Cl.
CPC .. *B60K 2370/143* (2019.05); *B60K 2370/158* (2019.05); *B60K 2370/691* (2019.05); *H03K 2217/96038* (2013.01); *H03K 2217/960755* (2013.01)

(58) Field of Classification Search
CPC ..... H03K 17/9645; H03K 2217/96038; H03K 2217/960755; B60H 2370/128
USPC .......................................................... 701/36
See application file for complete search history.

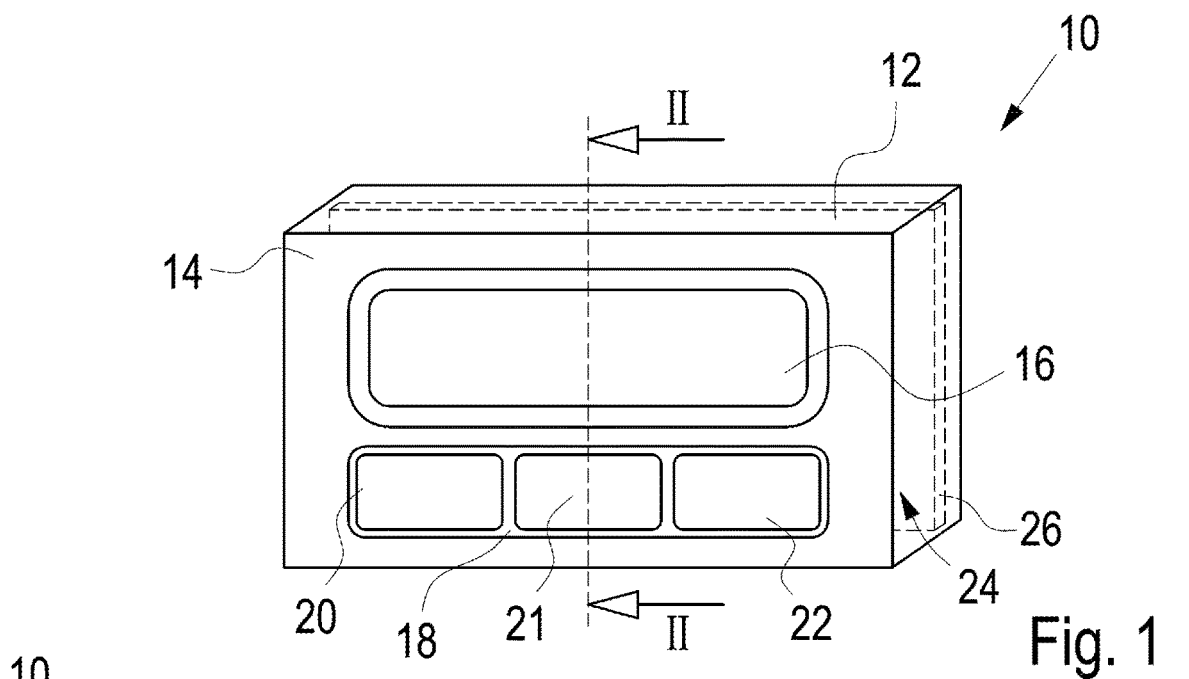
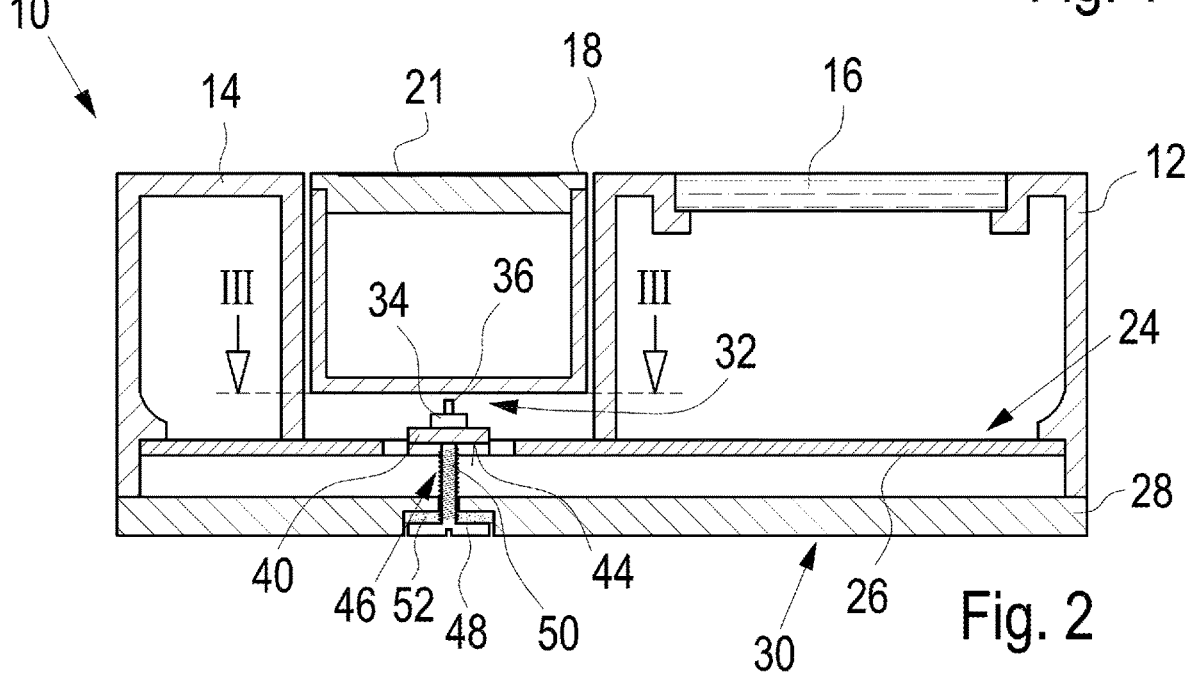
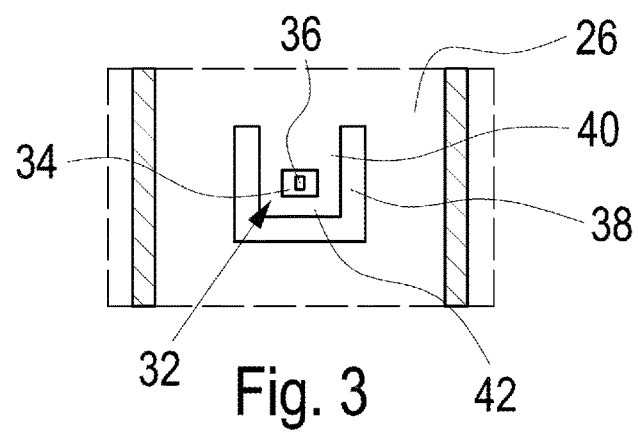

CONTROL DEVICE FOR A VEHICLE

CROSS REFERENCE

This application is the U.S. National Phase under 35 U.S.C. § 371 of International Application No. PCT/EP2019/058540 filed on Apr. 4, 2019, which claims the benefit of German Application No. 10 2018 108 847.7 filed on Apr. 13, 2018, the entire contents of each are hereby incorporated by reference.

The invention relates to an operating device for a vehicle and in particular for a vehicle component, such as an air conditioning system, a navigation device, an infotainment system, for example. In particular, the invention relates to a human-machine-interface (HMI) for a vehicle.

Operating devices for vehicles are designed and configured according to different operating concepts. In operating devices having operating keys it is sometime desirable to keep the key stroke as small as possible (so-called short-stroke keys). In particular, efforts are made to see to it during the manufacture of the operating devices that, notwithstanding predefined manufacturing tolerances, the operating elements adapted to be pressed down, such as e.g. operating keys or displays having a touch function, travel the required, in particular identical strokes until they reach the switch triggering position associated with the operating element. This is a challenge in particular in the case of short-stroke keys.

Operating devices where the pressing-down stroke of the operating elements is adapted to be adjusted are described in U.S. Pat. No. 6,919,522, US-A-2008/0316064 and US-A-2012/0044660. In the operating device according to US-A-2012/0044660 a switch associated with an operating key is located on a flexible circuit board which is adapted to be moved towards the operating elements by means of an adjustment screw for adjusting the stroke. In the operating devices according to US-A-2008/0316064 and U.S. Pat. No. 6,919,522 adjustment screws for adjusting the strokes are located at the operating keys.

It is an object of the invention to provide an operating device for a vehicle the design of which allows for a tolerance-compensating adjustment of the switch triggering position in a simple manner.

For achieving this object the invention suggests an operating device for a vehicle, provided with
- a housing having a front wall,
- at least one operating element which, starting from an initial position, is adapted to be manually actuated for inputting a command or for activating a function,
- a switch associated with the operating element and having a switching member upon which the operating element acts when being manually actuated,
- a supporting element arranged in the housing at a distance to the operating element,
- wherein the supporting element comprises a flexible bar having an upper side facing the operating element and a lower side facing away from the upper side, and
- wherein the switch associated with the operating element is arranged at the flexible bar, and
- an adjustment member acting upon the flexible bar for adjusting the bending position of the flexible bar relative to the operating element in its initial position and for keeping and thus stabilizing the flexible bar in its adjusted bending position when the operating element acts upon the switching member.

In the operating device according to the invention, the position of the switch relative to the operating element associated with this switch can be factory-adjusted. Typically, the switches associated with the operating elements are arranged on a circuit board or, generally speaking, a supporting element located behind the front wall of the housing inside the latter. Besides electric conductor traces, further electric and electronic components are arranged on the circuit board. The switches can be short-stroke switches or a pressure-sensitive mat resting on a circuit board, for example. Further, capacitively, resistively, inductively or optically operating switches configured as sensors and in particular path sensors can be employed.

According to the invention, the switch associated with an operating element is located on a flexible bar of the supporting element. When the supporting element is configured as a circuit board, this flexible bar can be configured as a web cut free on three sides whose one end is integrally connected to the circuit board and whose other end is exposed. However, the flexible bar can also be arranged on the supporting element as an additional separate component, such as a tongue or a similar protrusion element. An adjustment member acts upon the flexible bar, by means of which adjustment member the position of the flexible bar can be changed. Further, the adjustment member serves for stabilizing the bending position assumed by the flexible bar when, upon actuation of the operating element, the switching member of the switch is pressurized and thus pressure is possibly exerted upon the flexible bar via the switching member or the switch.

The fine adjustment of the desired switch triggering position can be performed such that, when the operating device is completed, the adjustment member associated with a switch and a flexible bar, respectively, is adjusted, with the operating element being in its initial position, for bending the flexible bar such that the switch is advanced towards the operating element. This process is continued until the switch and the switching element of the switch, respectively, is in its switch triggering position. The subsequent return movement or readjusting of the adjustment member by a predefined amount can now move the flexible bar into a bending position in which the switch is located at a distance to the operating element, which distance corresponds to the desired triggering path along which the operating element must be pressed down during actuation until the switching element has reached the switch triggering position.

The operating element typically is an element having a plurality of control buttons and a touch sensor system (operating capacitively, resistively, optically or inductively). Thus, the one switch is always used for triggering a command inputted by touching one of the control buttons on the operating element.

The adjustment member is preferably mounted on or guided along a reference element which has a defined and unchanging position with respect to the supporting element and the operating element (in its initial position). The adjustment member can be a screw, a wedge, an eccentric or a disk with a height increasing along the circumferential edge.

In other words, according to the invention as described above, it is advantageously provided that the switching element is adapted to be moved along a stroke into a switch triggering position by the operating element, and that the flexible bar is adapted to be moved into a bending position by means of the adjustment member and to be fixed in said bending position in which the triggering path, along which the operating element is adapted to be moved until e.g. a switching member reaches the switch triggering position, has a presettable length with assembly and/or manufacturing tolerances of the housing of the operating element and the switch being compensated for.

The adjustment member is appropriately configured as an adjustment screw having a threaded shaft, wherein the amount, by which the adjustment member is moved back when the switching member has reached the switch triggering position during fine adjustment of the switch, with the thread pitch being known, is defined on the basis of the extent of turning of the adjustment screw and can be purposefully applied.

When the adjustment element is configured as an adjustment screw having a threaded shaft, it can be advantageously provided that the threaded shaft is in threading engagement with the reference element positioned relative to the flexible bar of the supporting element. Thus, by turning the adjustment screw, the threaded shaft end can advance towards the flexible bar and bend the latter, wherein during return movement the flexible bar, due to its elasticity, follows the position of the threaded shaft end of the adjustment screw.

Alternatively of to what has been described above, the adjustment screw, as a "loose screw", can be kept in an axially positioned manner at the reference element, wherein, in this case, the threaded shaft of the adjustment screw is in threading engagement with the flexible bar and can bidirectionally bend the latter.

In order not to have to take into account the leverage ratio at the flexible bar during fine adjustment of the switch by bending and return bending, respectively, of the flexible bar, it is advantageous when the adjustment element acts upon the flexible bar at a position located in the extension of the movement of the switching member when the latter is actuated by the operating element. When the adjustment member rests upon one side of the flexible bar, the adjustment member more or less strongly acting upon the flexible bar when being adjusted, to bend the latter towards the operating element and to relieve the flexible bar during the return movement, it is provided, according to an advantageous embodiment of the invention, that the switch is arranged on the upper side of the flexible bar facing the operating element and that the adjustment screw rests upon the lower side of the flexible bar facing away from the upper side and in a manner flush with the switch.

The concept according to the invention allows for switch systems to be arranged in a group such that a short response of the operating element over strokes shorter than 0.4 mm is possible. Further, extremely short actuating paths (shorter than 0.3 mm) can be realized. The tolerance of the switch system arranged in a group can be reduced to less than +/−0.1 mm. The tolerances of individual parts (key body, guiding of keys on the housing and the front panel, respectively, switch, switching element) and the assembly thereof can be compensated for.

According to another advantageous embodiment of the invention, it can be provided that the operating device is provided with a haptic feedback. The operating comfort is enhanced when the user receives a signaling concerning the recognition of a valid operation of the operating element. Advantageously, this is predominantly effected by tactile feedback. Such a haptic feedback can be realized mechanically, electromechanically or electrically, for example. A mechanical tactile feedback can be realized by mechanically exciting the display by means of an actuator using pulses. Another possibility of realizing a haptic feedback is to impress bending undulations into the display and the cover glass of the display, respectively. Another possibility of realizing the haptic feedback is a purely electrically operating variant using locally generated electrical fields.

Hereunder the invention will be explained in detail on the basis of an exemplary embodiment with reference to the drawing in which:

FIG. 1 shows a front (perspective) view of an operating device,

FIG. 2 shows a sectional view of the operating device along II-II of FIG. 1,

FIG. 3 shows a sectional view in the area III-III of FIG. 2, and

Figure 4:
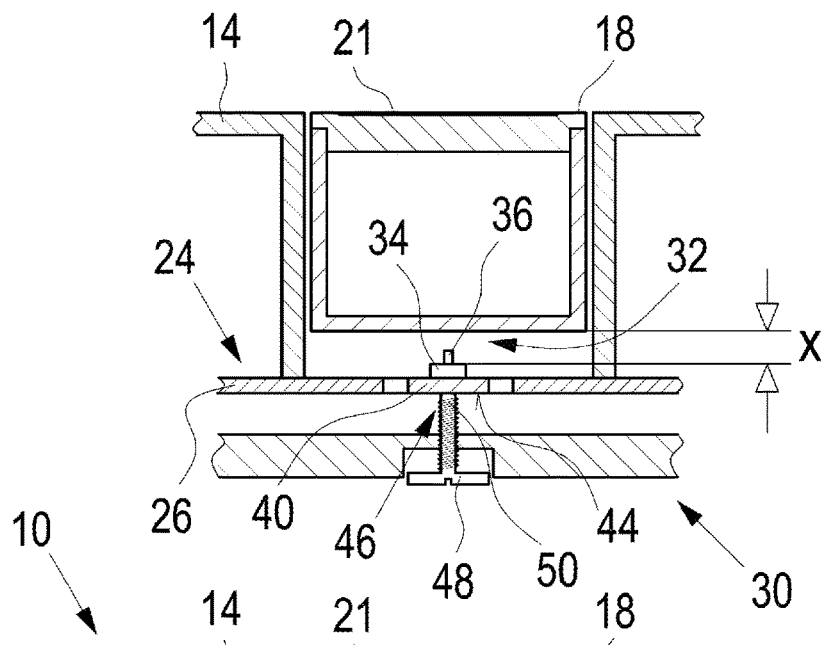
FIGS. 4 to 6 show the individual phases of the fine adjustment of the switch system (with respect to an operating element).

In FIGS. 1 to 3 the basic design of an exemplary embodiment of an operating device 10 is shown. In this exemplary embodiment, the operating device 10 comprises a housing 12 at whose front wall 14 a display 16 as well as an operating element 18 configured as a strip having three operating panels 20, 21, 22 are located, for example. Inside the housing 12 a supporting element 24 for various electric and electronic components is located. Typically, this supporting element 24 is a circuit board 26. The housing 12 further comprises a rear wall 28 which, in this exemplary embodiment, also serves as a reference element 30, which will be specified in detail later.

As can be seen in the sectional views of FIGS. 2 and 3, in this exemplary embodiment, below the operating element 18a mechanical switch 32 is located which comprises a switch housing 34 and a switching member 36. In this case, the switching member 36 is configured as a plunger which, when being pressed down, moves an electrically conducting element for establishing an electrical connection of two contact panels, for example. When the operating element 18 is actuated a sensor recognizes (e.g. capacitively) which one of the operating panels 20, 21, 22 is touched with a finger of a hand, for example, for executing the command corresponding to the touched operating panel when the switch 32 is triggered.

The switch 32 is located in an area of the supporting element 24 where the latter comprises a U-shaped free cut 38, for example. In this manner, a flexible bar 40 is produced on whose upper side 42 facing the operating element 18 the switch 32 is located.

An adjustment member 46 acts upon the lower side 44 of the flexible bar 40, which adjustment member is configured as an adjustment screw 48 having a threaded shaft 50 in this exemplary embodiment. The threaded shaft 50 of the adjustment screw 48 is in threading engagement with a bore in the rear wall 28. Preferably, the threaded shaft end of the adjustment screw 48 acts upon the lower side of the flexible bar 40 opposite the switch 32 by resting upon said lower side.

In FIG. 2 the flexible bar 40 is bent towards the operating element 18 such that the switch 32 is in the desired position relative to the initial position of the operating element 18. This spaced-apart position determines that the operating element 18, after having been pressed down along the desired path, triggers the switch 32. The operating element 18 is secured in a conventional manner against moving out of the housing 12 by engagement or snap-fit hooks, for example.

Figure 5:
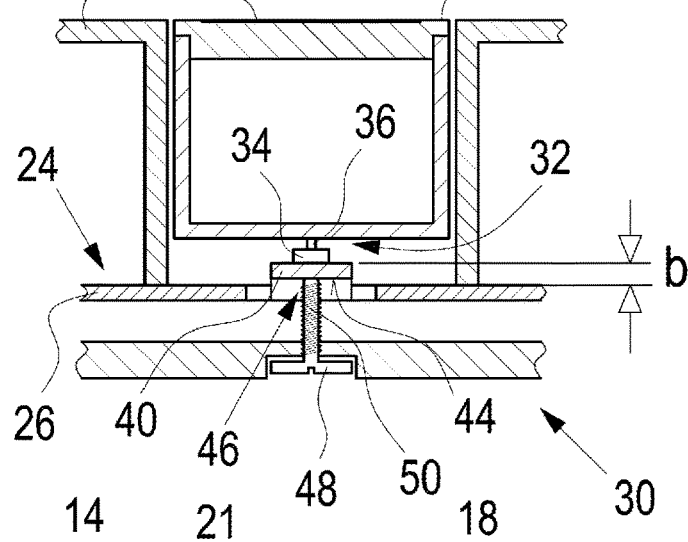
Figure 6:
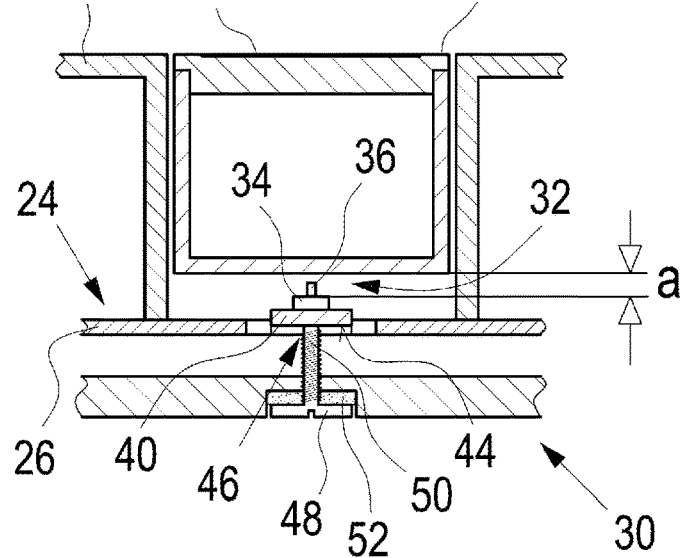

The process of the inventive fine adjustment of the switch system constituted of the operating element 18 and the associated switch 32 is briefly described hereunder with reference to FIGS. 4 to 6.

At the beginning of the adjustment process, the switch 32 (in this case the switch housing 34) is spaced apart from the lower side of the operating element 18 in its initial position by a distance x (see FIG. 4) which is larger than the desired triggering path a (see FIG. 6). The flexible bar 40 is bent towards the operating element 18 by means of the adjustment screw 48, whereby the switch 32 is moved against the lower side of the operating element 18. After the bar has traveled the adjusting or bending path b, the switch 32 triggers (see FIG. 5). The switching signal is read in via e.g. a device-test-interface when the assembly of the operating device 10 is completed, whereby the further actuation of the adjustment screw 48, which is performed automatically, for example, is terminated. Now it is known when the switch 32 will trigger.

In this situation, the switch system is in the switched state and arranged without any clearance. It should be noted that the switch 32 should not be in its blocked state, i.e. pushed down up to its stop position; this serves as a mechanical protection of the switch 32.

In other words, in the situation illustrated in FIG. 5, it is known where the (clearance-free) switching point of the switch 32 is located.

By implication, by a purposeful readjusting of the adjustment screw 48 an exact clearance-free stroke (triggering path) of the switch system can be adjusted. This readjusting of the adjustment screw 48 by turning it back, moves the switch 32 into its final position in which, when the operating element 18 is pressed down, the switching element 36 of the switch 32 is moved up to the switch triggering position and thus the operating element 18 is moved along the triggering path a (see FIG. 6).

The adjustment member 46, i.e. the adjustment screw 48 in this exemplary embodiment, can then be fixed e.g. by securing the screw head with adhesive, as indicated at 52. In addition, the adjustment member 46 thus stabilizes the flexible bar 40 in its bending position assumed after the adjustment.

The method and the operating device design and the switch system constituted of the operating element 18 and the switch 32 as well as the flexible bar 40 described above allow for reducing the tolerance chain of this mechanical "group system" to zero. Short strokes can be compensated for despite large component tolerances and large tolerance chains in the group.

LIST OF REFERENCE NUMERALS

10 Operating device
12 Housing
14 Front wall
16 Display
18 Operating element
20 Operating panel
21 Operating panel
22 Operating panel
24 Supporting element
26 Circuit board
28 Rear wall
30 Reference element
32 Switch
34 Switch housing
36 Switching member
38 Free cut
40 Flexible bar
42 Upper side
44 Lower side
46 Adjustment member
48 Adjustment screw
50 Threaded shaft
52 Adhesion
x Distance
a Triggering path
b Bending path

The invention claimed is:

1. An operating device for a vehicle, comprising:
a housing having a front wall,
at least one operating element which, starting from an initial position, is adapted to be manually actuated for inputting a command or for activating a function,
a switch associated with the operating element and having a switching member upon which the operating element acts when being manually actuated,
a supporting element arranged in the housing at a distance to the operating element,
wherein the supporting element comprises a flexible bar having an upper side facing the operating element and a lower side facing away from the upper side,
wherein the switch associated with the operating element is arranged at the flexible bar, and
an adjustment member acting upon the flexible bar for adjusting the bending position of the flexible bar relative to the operating element in its initial position and for keeping and thus stabilizing the flexible bar in its adjusted bending position when the operating element acts upon the switching member.

2. The operating device according to claim 1, wherein the switch comprises a switching member adapted to be moved by the operating element along a stroke up to a switch triggering position, and that the flexible bar is adapted to be both displaced into a bending position by means of the adjustment member and fixed in said bending position, wherein, in the bending position, the stroke has a presettable length, in consideration of compensation of manufacturing and/or of assembly tolerances of the housing, of the operating element and of the switch.

3. The operating device according to claim 2, wherein the adjustment member is configured as an adjustment screw having a threaded shaft and which is in threading engagement with a reference element positioned relative to the flexible bar of the supporting element, and that by turning the adjustment screw the flexible bar is adapted to be bent.

4. The operating device according to claim 2, wherein the adjustment member is configured as an adjustment screw having a threaded shaft and which is axially held in a turnable manner at a reference element positioned relative to the flexible bar of the supporting element, that the threaded shaft of the adjustment screw is in threading engagement with the flexible bar, and that, when the adjustment screw is turned, the flexible bar is adapted to be bent.

5. The operating device according to claim 2, wherein the adjustment member acts upon the flexible bar at a position arranged in alignment with the extension of the moving axis, extending through the switch, of the operating element of the switching member when the latter is actuated.

6. The operating device according to claim 2, wherein the switch is arranged on the upper side of the flexible bar facing the operating element, and that the adjustment screw rests upon the lower side of the flexible bar facing away from the upper side and in a manner flush with the switch.

7. The operating device according to claim 2, wherein an electrically or electromechanically or electromagnetically operating feedback unit for a tactile feedback of a valid manual actuation of the operating element.

8. The operating device according to claim 1, wherein the adjustment member is configured as an adjustment screw having a threaded shaft and which is in threading engagement with a reference element positioned relative to the flexible bar of the supporting element, and that by turning the adjustment screw the flexible bar is adapted to be bent.

9. The operating device according to claim 1, wherein the adjustment member is configured as an adjustment screw having a threaded shaft and which is axially held in a turnable manner at a reference element positioned relative to the flexible bar of the supporting element, that the threaded shaft of the adjustment screw is in threading engagement with the flexible bar, and that, when the adjustment screw is turned, the flexible bar is adapted to be bent.

10. The operating device according to claim 1, wherein the switch comprises at least two contacts electrically connected in a switch triggering position, or that the switch is configured as a path sensor which operates in an optical, capacitive, resistive or inductive manner.

11. The operating device according to claim 1, wherein the adjustment member acts upon the flexible bar at a position arranged in alignment with the extension of the moving axis, extending through the switch, of the operating element of the switching member when the latter is actuated.

12. The operating device according to claim 1, wherein the switch is arranged on the upper side of the flexible bar facing the operating element, and that the adjustment screw rests upon the lower side of the flexible bar facing away from the upper side and in a manner flush with the switch.

13. The operating device according to claim 1, wherein an electrically or electromechanically or electromagnetically operating feedback unit for a tactile feedback of a valid manual actuation of the operating element.

\* \* \* \* \*